United States Patent
Reboh et al.

(10) Patent No.: US 9,899,217 B2
(45) Date of Patent: Feb. 20, 2018

(54) METHOD FOR PRODUCING A STRAINED SEMICONDUCTOR ON INSULATOR SUBSTRATE

(71) Applicants: COMMISSARIAT A L'ENERGIE ATOMIQUE ET AUX ENE ALT, Paris (FR); STMICROELECTRONICS SA, Montrouge (FR)

(72) Inventors: Shay Reboh, Sassenage (FR); Yves Morand, Grenoble (FR); Hubert Moriceau, Saint-Egreve (FR)

(73) Assignees: Commissariat a l'energie atomique et aux energies alternatives, Paris (FR); STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 14/555,897

(22) Filed: Nov. 28, 2014

(65) Prior Publication Data

US 2015/0155170 A1 Jun. 4, 2015

(30) Foreign Application Priority Data

Nov. 29, 2013 (FR) .................................... 13 61838

(51) Int. Cl.
*H01L 21/02* (2006.01)
*H01L 21/762* (2006.01)
(Continued)

(52) U.S. Cl.
CPC .. *H01L 21/02689* (2013.01); *H01L 21/02381* (2013.01); *H01L 21/02488* (2013.01); *H01L 21/02532* (2013.01); *H01L 21/02667* (2013.01); *H01L 21/02686* (2013.01); *H01L 21/26506* (2013.01); *H01L 21/7624* (2013.01);
(Continued)

(58) Field of Classification Search
CPC ......... H01L 21/02667; H01L 21/02675; H01L 21/02678; H01L 21/02683; H01L 21/02686; H01L 21/02689; H01L 21/02532; H01L 21/02488; H01L 27/1203; H01L 29/1054
USPC .............. 257/66, 75, 65, 347, 351, E21.133, 257/E21.415; 438/166, 486
See application file for complete search history.

(56) References Cited

U.S. PATENT DOCUMENTS 6,689,671 B1 * 2/2004 Yu ..................... H01L 21/02381
257/E21.129
6,713,819 B1 * 3/2004 En ........................... H01L 21/84
257/131
(Continued)

OTHER PUBLICATIONS

U.S. Appl. No. 14/575,329, filed Dec. 18, 2014, Maitrejean, et al.
(Continued)

*Primary Examiner* — Fernando L Toledo
*Assistant Examiner* — Aaron Gray
(74) *Attorney, Agent, or Firm* — Oblon, McClelland, Maier & Neustadt, L.L.P.

(57) ABSTRACT

A method is provided for producing a microelectronic device provided with different strained areas in a superficial layer of a semi-conductor on insulator type substrate, including amorphizing a region of the superficial layer and then a lateral recrystallization of the region from crystalline areas adjoining the region.

22 Claims, 12 Drawing Sheets

(51) Int. Cl.
*H01L 21/84* (2006.01)
*H01L 29/10* (2006.01)
*H01L 21/265* (2006.01)
*H01L 29/786* (2006.01)
*H01L 27/12* (2006.01)
*H01L 29/66* (2006.01)
*H01L 29/78* (2006.01)

(52) U.S. Cl.
CPC .......... *H01L 21/84* (2013.01); *H01L 27/1203* (2013.01); *H01L 29/1054* (2013.01); *H01L 29/66742* (2013.01); *H01L 29/66772* (2013.01); *H01L 29/7847* (2013.01); *H01L 29/78654* (2013.01); *H01L 29/78684* (2013.01)

(56) References Cited

U.S. PATENT DOCUMENTS

| | | | |
|---|---|---|---|
| 6,759,677 B1* | 7/2004 | Yamazaki | H01L 21/02532 257/59 |
| 2005/0124146 A1 | 6/2005 | Bedell et al. | |
| 2006/0014366 A1 | 1/2006 | Currie | |
| 2007/0252205 A1* | 11/2007 | Hoentschel | H01L 21/84 257/347 |
| 2008/0124858 A1* | 5/2008 | Nguyen | H01L 21/84 438/217 |
| 2008/0296692 A1* | 12/2008 | Griebenow | H01L 21/26506 257/368 |
| 2009/0087974 A1* | 4/2009 | Waite | H01L 21/28088 438/592 |
| 2010/0025771 A1* | 2/2010 | Hoentschel | H01L 21/26506 257/369 |

OTHER PUBLICATIONS

T. Tezuka, et al., "Fabrication of strained Si on an ultrathin SiGe-on-insulator virtual substrate with a high-Ge fraction" Applied Physics Letters, vol. 79, No. 12, Sep. 17, 2001, pp. 1798-1800 and cover page.

B. Vincent, et al., "The Ge condensation technique: A solution for planar SOI/GeOI co-integration for advanced CMOS technologies?" Materials Science in Semiconductor Processing, vol. 11, 2008, pp. 205-213.

French Preliminary Search Report dated Sep. 2, 2014, in French Application No. 13 61838 filed Nov. 29, 2013 (with English Translation of Categories of Cited Documents).

U.S. Appl. No. 14/791,713, filed Jul. 6, 2015, Reboh, et al.

* cited by examiner

METHOD FOR PRODUCING A STRAINED SEMICONDUCTOR ON INSULATOR SUBSTRATE

TECHNICAL FIELD AND STATE OF PRIOR ART

The present description relates to the field of structures formed by a semi-conductor on insulator type substrate, and more particularly that of devices provided with a semi-conducting layer having a mechanical deformation or strain and which is provided on an insulating material.

By mechanical deformation, it is meant a material the crystal lattice parameter(s) of which is (are) lengthened or shortened.

In the case where the deformed lattice parameter is higher than said "natural" parameter of the crystalline material, it is said to be in tensile or tension deformation. When the deformed lattice parameter is smaller than the natural lattice parameter, the material is said in compressive or compression deformation.

With these mechanical deformation states, states of mechanical strains are associated. However, it is also common to refer to these deformation states as states of mechanical strains. In the continuation of the present application, this notion of deformation will be generically designated by the term "strain".

For some applications, in particular for producing transistors, it can be advantageous to provide a layer of strained semi-conductor material.

A tensile or compressive mechanical strain on a semi-conducting layer enables an increase in the speed of charge carriers to be induced, thus improving the performance of devices with transistors formed in such a layer.

A semi-conductor on insulator type substrate is commonly formed by a supporting layer covered and in contact with an insulating layer, itself covered, and in contact with a semi-conducting superficial layer generally intended to act as an active layer, that is wherein at least one part of electronic components such as transistors is intended to be formed.

It is known to make strained semi-conductor on insulator type substrates, that is wherein the material of the semi-conducting superficial layer lying on the insulating layer is based on a strained material.

It is for example possible to produce sSOI ("strained Silicon On Insulator") type substrates including a tensile strained silicon superficial layer, wherein N-type transistors having an improved performance can be formed. Such a layer is however detrimental to producing P-type transistors.

It is also known to make devices wherein on a same support, one or more transistors are tensile strained whereas one or more transistors are compressive strained.

Document US 2008/0124858 A1 provides an exemplary method wherein an NMOS type transistor and a PMOS type transistor are formed on a same semi-conductor on insulator type substrate, from a tensile strained semi-conducting layer. In this method, after producing the transistors, areas of this semi-conducting layer which are provided on either side of a channel region of the PMOS transistor are amorphized by carrying out a localized implantation of a portion of the semi-conducting layer, and then a recrystallization of this portion in order to relax the strain for the PMOS transistor.

The amorphizing implantation step can tend to induce dislocations in the transistors.

Besides, when the recrystallization is carried out after producing transistors, the management of the thermal budget required can turn out to be restrictive.

Further, because of the presence of the gate stack, it can be difficult to achieve an efficient relaxation of the mechanical strains of the channel region of the transistor.

The problem arises to discover a new method allowing the implementation on a same semi-conductor on insulator type substrate, of semi-conducting areas having different strains, and which does not have the abovementioned drawbacks.

DISCLOSURE OF THE INVENTION

The present invention relates according to one aspect, to a method comprising, on a strained semi-conductor on insulator type substrate provided with a supporting layer, an insulating layer, and a superficial layer based on a crystalline strained semi-conductor material provided on said insulating layer, steps of:

a) amorphizing at least one region of said semi-conductor material of said superficial layer, while keeping the crystalline structure of at least one area of said superficial layer of strained semi-conductor material adjoining said region, b) carrying out a recrystallization of said region by using at least one lateral face of said area of crystalline strained semi-conductor material in contact with said region as a starting area of a recrystallization front.

Step a) enables the strain to be relaxed in the amorphized region.

In step b), the recrystallization is preferably only lateral. Thus, the recrystallization is only due to one or more recrystallization fronts propagating in a direction parallel to the insulating layer or to the main plane of the substrate.

For this, the amorphized and then recrystallized region can be arranged such that in step b), it is not covered with any other material or so as to be covered and in contact with a given material from which a recrystallization front cannot be generated.

The given material is preferably not crystalline or polycrystalline and can be an amorphous material such as for example a dielectric material or a resin.

Thus, the recrystallization of said region is carried out by only using lateral face(s) of said area of strained crystalline semi-conductor material in contact with said region as starting area(s) of recrystallization front(s), without vertical recrystallization fronts being created.

The region obtained at the end of step b) is thus relaxed.

Thus, according to the invention, at the end of step b), a semi-conductor on insulator type substrate the superficial layer of which includes strained areas and at least one region relaxed from the mechanical strains can be produced.

From this substrate, components such as transistors can then be formed.

The production of the relaxed region is carried out prior to forming components which enables in particular the mechanical strains of said region of the superficial layer to be better relaxed while enabling an additional step of annealing or thermal budget requirements to be avoided during the production of the component(s).

The amorphization in step a) can be made by ionic implantation.

In this case, step b) of recrystallization can include at least one heat treatment.

Alternatively, the amorphization in step a) and the recrystallization in step b) can be performed through a laser.

Preferably, step a) of amorphization is made throughout the thickness of said region of the superficial layer. An amorphization of a region of the superficial layer through its thickness, up to the insulating layer of the substrate can enable a region relaxed from the mechanical strains after recrystallization to be obtained. This also enables an only lateral recrystallization to be performed, that is only by using recrystallization fronts parallel to the substrate.

According to a first possible implementation of the method, the strained semi-conductor material can be tensile strained silicon.

Advantageously, after step b) of recrystallization, a step of enriching said region with Germanium can be carried out. This can allow a semi-conductor on insulator type substrate to be made, the superficial layer of which includes at least one Germanium enriched compressive strained region.

From a substrate obtained according to this first possible implementation, a microelectronic device with transistors provided with at least one P-type transistor, in particular a PFET or PMOS, and with at least one N-type transistor, in particular NFET or NMOS can be formed, said region relaxed or compressive strained in a plane parallel to the main plane of the substrate, being intended to form a channel region for said transistor P, said tensile strained area in said plane being intended to form a channel region for said N transistor.

Alternatively, according to a second possible implementation of the method, said strained semi-conductor material can be compressive strained silicon germanium ($Si_xGe_{1-x}$ with $0 \leq x \leq 1$).

The compressive strained silicon germanium can be advantageously obtained prior to step a), by enriching a Si layer lying on said insulating layer with Ge.

From a substrate obtained according to this second possible implementation, a microelectronic device with transistors provided with at least one N-type transistor, in particular NFET or NMOS, and at least one P-type transistor, in particular PFET or PMOS can then be formed, said region being intended to form a channel region for said N transistor, said area being intended to form a channel region for said P transistor.

According to a possible implementation of the method, a partial recrystallization of said region can be carried out so as to keep an amorphous portion in said region at the end of the recrystallization.

According to a possible implementation of the method, the region amorphized in step a) and recrystallized in step b) can include a first lateral face adjoining the crystalline area of said superficial layer and at least one second lateral face which is not in contact with an area of the crystalline material.

Advantageously, the other lateral faces of the amorphous region are not in contact with an area of crystalline material. In this case, a single recrystallization lateral front propagating in a single direction during recrystallization can be formed.

One embodiment of the invention relates to a device implemented using a method as previously defined.

One embodiment of the invention also relates to a strained semi-conductor on insulator type substrate obtained using a method such as previously defined and provided with a supporting layer, an insulating layer, a superficial layer based on a semi-conductor material, an area of said superficial layer lying on said insulating layer being based on a tensile strained crystalline semi-conductor material, a region of said superficial layer also lying on said insulating layer and adjacent to said zone being based on a relaxed crystalline semi-conductor material or based on a compressive strained material.

One embodiment of the invention also relates to a device with transistors comprising such a substrate.

One embodiment of the invention relates to a method for producing a semi-conducting portion having a uni-axial strain, comprising steps of, providing a strained semi-conductor on insulator type substrate comprising a supporting layer, an insulating layer provided on the supporting layer, and a semi-conducting superficial layer having a thickness e based on a crystalline strained semi-conductor material provided on and in contact with the insulating layer, a semi-conducting portion of the superficial layer being surrounded and in contact with insulating areas, amorphizing at least one region of the portion based on a strained semi-conductor material while keeping the crystalline structure of at least one area of this portion adjoining said region, said area having a critical dimension lower than 6 times the thickness e of the superficial layer, b) carrying out a recrystallization of said region by using at least one lateral face of the area of semi-conductor material in contact with said region as a starting zone of a recrystallization front, said region being arranged in step b) such that it is not covered with any other material or so as to be covered and in contact with a material from which a recrystallization front cannot be generated.

According to a possible implementation, the strained semi-conductor material can be tensile strained silicon.

According to another possible implementation, the strained semi-conductor material is compressive strained silicon germanium.

One embodiment of the invention comprises forming a microelectronic device with transistors, comprising carrying out a method as defined above, and then after the step of recrystallization, producing at least one P-type transistor or at least one N transistor, a semi-conducting portion being intended to form a channel region for said P or N-type transistor.

Another embodiment of the invention provides a method comprising steps of, providing a strained semi-conductor on insulator type substrate comprising a supporting layer, an insulating layer provided on the supporting layer, and a semi-conducting superficial layer, a rectangular semi-conducting portion of the superficial layer being surrounded and in contact with insulating areas, amorphizing at least one triangular region of the rectangular portion based on a strained semi-conductor material while keeping the crystalline structure of at least one area of this portion adjoining said region, said amorphized region having faces adjoining the insulating areas, carrying out a recrystallization of said region by using at least one face of said area in contact with said region as a starting area of a recrystallization front.

BRIEF DESCRIPTION OF THE DRAWINGS

The present invention will be better understood upon reading the description of exemplary embodiments given by way of only indicating and in no way limiting purposes, with reference to the appended drawings wherein.

Identical, similar or equivalent parts of the different figures bear the same reference numerals so as to facilitate switching from one figure to the other.

Figure 1A:
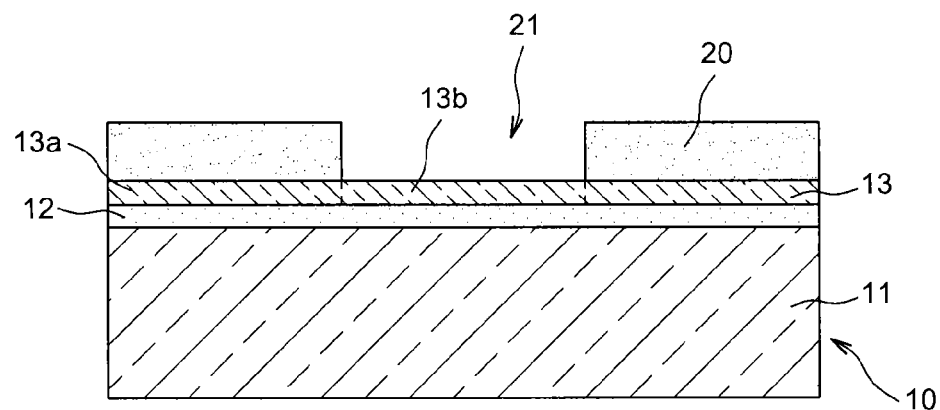
FIGS. 1A-1E illustrate a method for producing a strained semi-conductor on insulator type substrate provided with a generally compressive strained semi-conducting superficial layer and including at least one region wherein this strain is relaxed.

The different parts represented in the figures are not necessarily drawn to a uniform scale, for making the figures more legible.

Further, in the description herein after, terms which depend on the orientation of the structure are applied considering that the structure is oriented in the way illustrated in the figures.

DETAILED DISCLOSURE OF PARTICULAR EMBODIMENTS

An exemplary method according to the invention will now be described in connection with FIGS. 1A-1E.

The starting material of this method is a strained semi-conductor on insulator type substrate, for example of the sSOI type, comprising a semi-conducting superficial layer 13, on and in contact with an insulating layer 12 which can be based on silicon oxide and which is provided on and in contact with the supporting layer 11. The insulating layer 12 can have a thickness for example between 10 nm and 100 nm. The substrate includes the semi-conducting superficial layer 13, in this example based on Si, which is strained and located on and in contact with said insulating layer 12. The semi-conducting superficial layer 13 is in this example tensile strained. This semi-conducting superficial layer 13 can have a thickness for example between 5 nm and 50 nm.

Then a masking 20 is formed, which can be for example based on a photosensitive polymer or a hard mask, on one or more areas 13a of the semi-conducting superficial layer 13, whereas at least one region 13b juxtaposed to the areas 13a covered by the masking 20 is exposed.

Transistors channels of a first type, for example of an N-type, can be intended to be made in the areas 13a of the semi-conducting superficial layer 13 covered by the masking 20.

In the region 13b which is not covered by the masking 20, at least one transistor channel of the second type, for example of the P-type, can be intended to be formed.

Figure 1B:
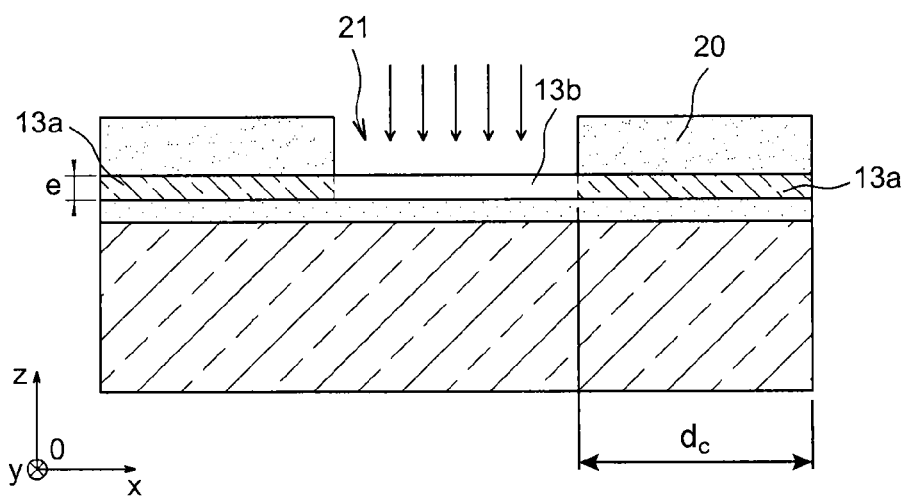

Through an aperture 21 of the masking 20, an ionic implementation is then carried out, so as to amorphize the region 13b of the semi-conducting superficial layer 13, whereas the areas 13a protected by the masking 20 are not implanted and thus keep their crystalline structure (FIG. 1B).

In the particular example of FIG. 1B, the region 13b is advantageously amorphized throughout its thickness e (measured in a direction z of an orthogonal reference frame [O; x; y; z] in FIG. 1B), that is up to the insulating layer 12 of the substrate.

The amorphizing implantation can be made for example based on Ge, or Si, or As, or C, or Ar, or N, or P atoms at an energy selected as a function of the nature of the implanted species and the nature and thickness of the semi-conducting superficial layer 13.

The implantation energy can be for example between 3 keV and 40 keV, and the implantation dose is for example between $10^{14}$ and $5 \times 10^{15}$ atoms/cm$^2$.

For example, to amorphize a thickness of 15 nm Si, Si ions can be implanted at an energy between 6 keV to 8 keV at a dose between $4 \times 10^{14}$ and $1 \times 10^{15}$ atoms/cm$^2$.

To amorphize a thickness of 30 nm Si, Si ions can be implanted at an energy between 14 keV and 25 keV at a dose in the order of $5 \times 10^{14}$ atoms/cm$^2$.

Figure 1C:
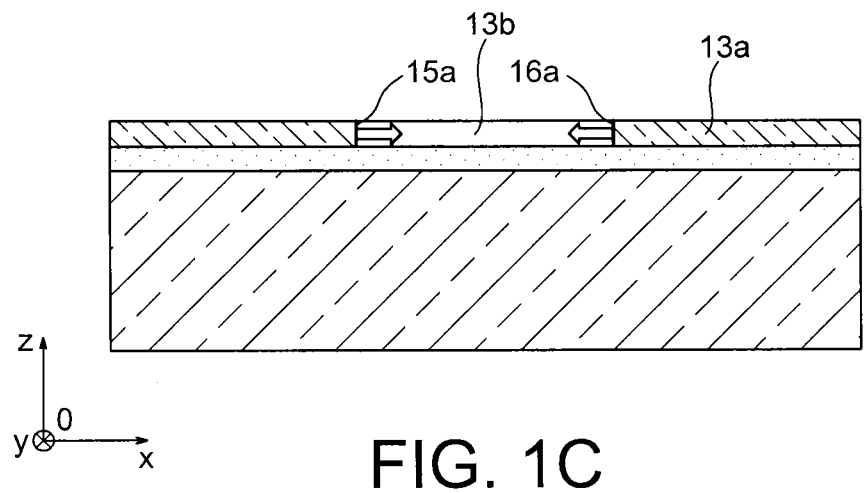

Then, the masking 20 can be removed and a recrystallization of the amorphized region 13b can be carried out, by using lateral faces 15a, 16a of areas 13a adjacent to and adjoining the lateral faces of the region 13b, as starting areas of recrystallization fronts (FIG. 1C). The lateral faces 15a, 16a of the areas 13a and the lateral faces of the region 13b extend in the example of FIG. 1C parallel to an axis z of an orthogonal reference frame [0, x, y, z].

In the particular example of FIG. 1C, the region 13b is provided with lateral faces adjoining the crystalline areas 13a. This region 13b also includes an upper face which extends parallel to the axis plane [0, x, y] of the orthogonal reference frame [0, x, y, z], which upper face is exposed, not covered and not in contact with any other material. The region 13b further includes a lower face which extends parallel to the axis plane [0, x, y] of the orthogonal reference frame [0, x, y, z] and is provided on and in contact with the insulating layer 12 of the substrate.

Due to the arrangement of the region 13b, the recrystallization implemented is herein only lateral. The upper face of the region 13b and the lower face of the region 13b are not indeed favorable areas for creating a recrystallization front because in contact with one or more materials which are preferably amorphous.

The starting areas at the recrystallization fronts are not parallel to the main plane of the substrate (herein defined and throughout the description as a plane passing through the substrate and parallel to the plane [0, x, y] given in FIG. 1C), but make a non-zero angle with the main plane of the substrate. The recrystallization is in particular made by solid phase epitaxial regrowth (SPER).

To carry out the recrystallization, an annealing is performed at a temperature between for example 450° C. and 1 100° C. or between 500° C. and 1 100° C., in particular between 450° C. and 650° C. during a period of time between for example 1 s and 15 h, for example between 1 s and 30 min.

Figure 1D:
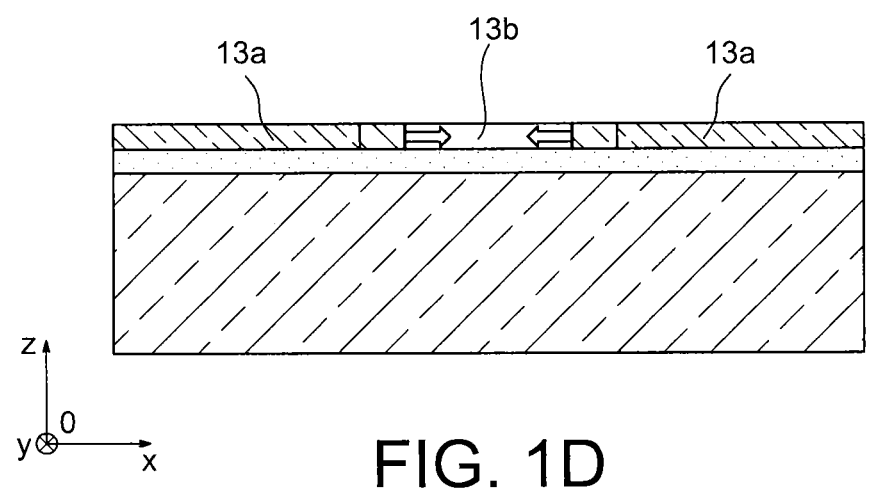

Crystal seeds are laterally grown from the periphery of the region 13b to its center, the recrystallization fronts moving horizontally, that is parallel to the main plane of the substrate (FIG. 1D).

Thus at the end of the only lateral recrystallization, a semi-conductor on insulator type substrate whose semi-conducting superficial layer intended to act as an active layer includes areas 13a of strained semi-conductor material, herein strained silicon, which are provided on either side of a recrystallized semi-conducting region 13b which is relaxed (FIG. 1E) is obtained. The areas 13a of the strained semi-conductor material are adjacent to and in contact with the recrystallized and relaxed semi-conducting region 13b.

Then, components, in particular transistors, can be formed, from the areas 13a and the region 13b of the substrate.

Figure 2:
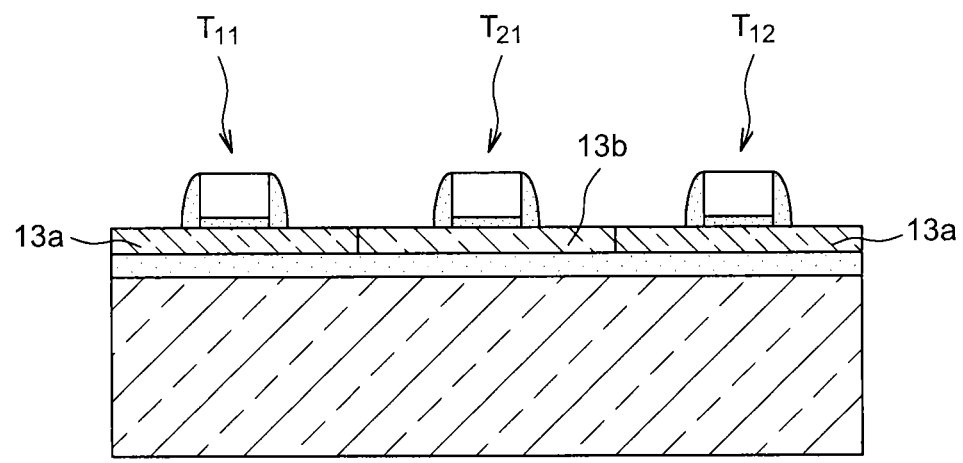
FIG. 2 illustrates a device with transistors formed on the substrate of FIG. 1E and wherein a N-type transistor channel is formed in the tensile strained semi-conducting layer and a P-type transistor channel is formed in said relaxed region of the semi-conducting layer.

Channels of NFET type transistors $T_{11}$, $T_{12}$ can be provided in the areas 13a of the semi-conducting superficial layer 13 wherein the tensile strain has been kept, whereas at least one channel of a PFET type transistor $T_{21}$ can be provided in the relaxed region 13b (FIG. 2).

To allow the strain in the areas 13a of the superficial layer 13 to be well kept, the masking 20 can be provided with a critical dimension dc higher than 6 times the thickness e of the superficial layer 13. Thus, the areas 13a have a critical dimension dc higher than 6 times the thickness e of the superficial layer 13.

By "critical dimension", it is meant the smallest dimension of a pattern except its thickness. The critical dimension of the masking 20 is in the example of FIG. 1B a dimension measured parallel to the plane [0; x; y] of an orthogonal plane [0; x; y; z], whereas the thickness is measured parallel to the axis z.

According to an alternative exemplary method just described, as a starting material, a strained semi-conductor on insulator type substrate of another type can be selected, for example sSiGeOI ("strained silicon germanium on insulator"), formed by a semi-conductor supporting layer 11, an insulating layer 12, and a semi-conducting superficial layer 14 based on $Si_xGe_{1-x}$ (with 0≤x≤1), in-plane compressive strained, and provided on, and in contact with the insulating layer 12.

The semi-conducting superficial layer 14 based on $Si_xGe_{1-x}$ can be obtained by enriching a silicon layer with Ge. Enriching the silicon layer with Germanium can be made for example using a so-called "Germanium condensation" technique such as described for example in document "Fabrication of strained Si on an ultrathin SiGe on Insulator virtual substrate with a high Ge fraction", Appl. Phys. Lett. 79, 1798, de 2001, by Tezuka et al. or in document "the Ge condensation technique: a solution for planar SOI/GeOI co-integration for advanced CMOS technologies", Materials Science in Semiconductor Processing 11 (2008) 205-213, of Damlencourt et al.

The germanium condensation can consist in depositing for example an $Si_xGe_{1-x}$, layer on an Si layer of an SOI substrate, and then oxidizing these semi-conducting layers so as to migrate the Germanium in the underlying Si layer, and then removing the oxidized superficial layer. A planarization of the $Si_xGe_{1-x}$, layer thus obtained, for example through CMP ("Chemical Mechanical Polishing") can then be carried out.

Figure 3A:
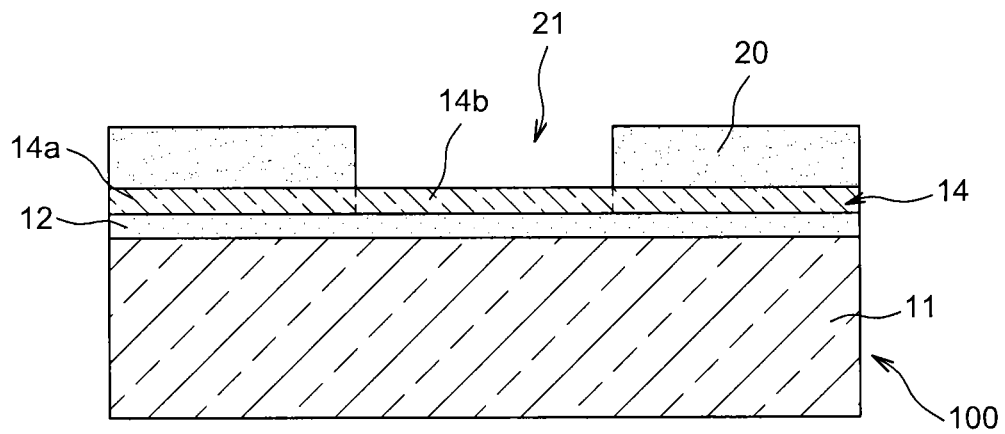
FIGS. 3A-3C illustrate a method for producing a strained semi-conductor on insulator type substrate provided with a generally compressive strained semi-conducting superficial layer and including at least one region wherein this strain is relaxed.

The masking 20 is then formed on areas 14a of the semi-conducting superficial layer 14 of $Si_xGe_{1-x}$, whereas at least one region 14b is exposed by an aperture in the masking 20 (FIG. 3A).

At least one channel of a P-type transistor is intended to be produced in the areas 14a of the semi-conducting superficial layer of $Si_xGe_{1-x}$, whereas at least one N-type transistor channel is intended to be made in the region 14b which is not covered by the masking 20.

Figure 3B:
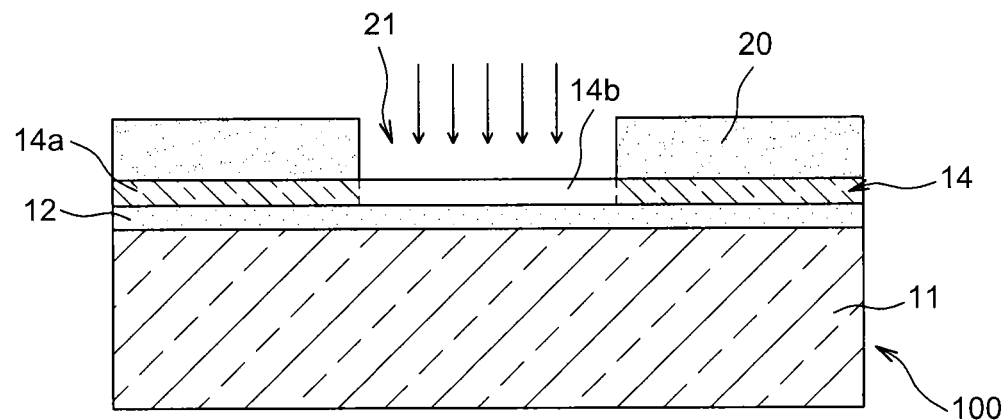

Then, the region 14b of the semi-conducting superficial layer 14 exposed by the aperture 21 of the masking 20 is amorphized, for example using an ion or laser beam (FIG. 3B).

The amorphization and recrystallization cause a relaxation in the strain exerted in the region 14b based on SiGe, whereas the areas 14a which are next to the region 14b and which have not been implanted keep their strain.

Figure 3C:
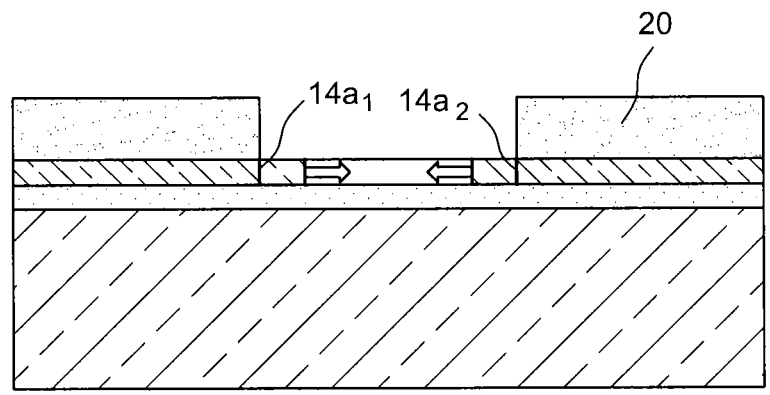

Then, a recrystallization annealing of the region 14b is carried out, by using lateral faces 14a1, 14a2 of the crystalline areas 14a provided on either side and adjoining the region 14b as starting areas to lateral recrystallization fronts (FIG. 3C). For this recrystallization, only lateral faces of the region 14b are in contact with a crystalline material, whereas the lower face of the region 14b is in contact with a dielectric material and the upper face of this region 14b is not in contact with any other material.

As in the exemplary embodiment described above in connection with FIGS. 1A-1E, the recrystallization carried out is only lateral.

The masking 20 can then be removed.

Figure 4:
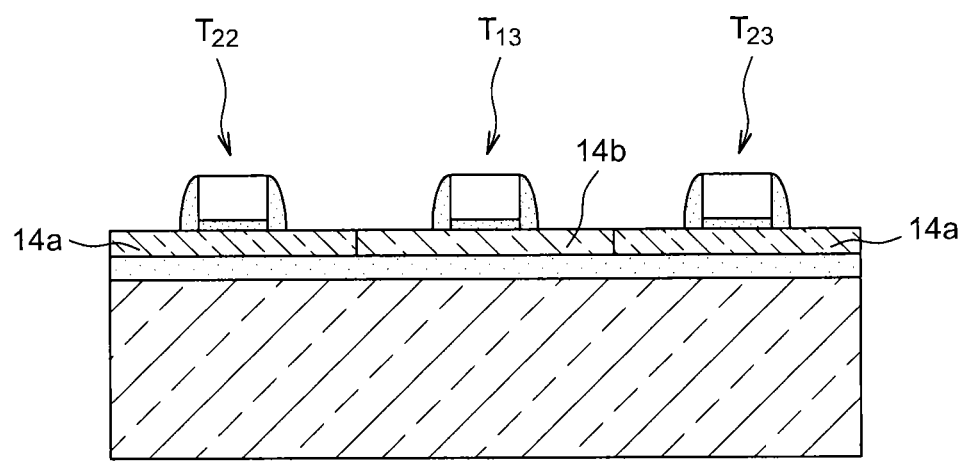
FIG. 4 illustrates a device with transistors formed on the substrate of FIG. 3C and wherein an N-type transistor channel is formed in the relaxed semi-conducting layer and a P-type transistor channel is formed in said compressive strained region.

Then, PMOS type $T_{22}$, $T_{23}$ transistors are produced from the areas 14a of the semi-conducting superficial layer 14 based on SiGe or the in-plane compression has been kept, whereas an NMOS type transistor $T_{13}$ is produced from the relaxed region 14b (FIG. 4). The transistors $T_{22}$, $T_{23}$ have thus a channel located in the compressive strained areas 14a, whereas the transistor $T_{13}$ has a channel located in a relaxed semi-conducting region 14b.

Figure 1E:
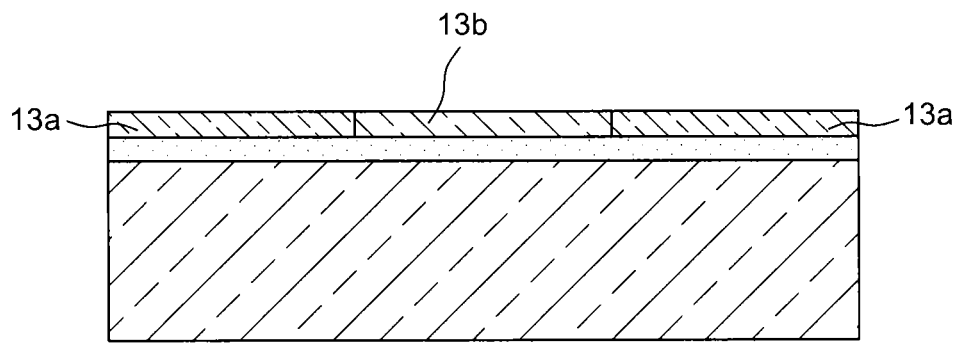

A substrate on insulator the semi-conducting superficial layer of which includes one or more strained semi-conducting areas according to a first strain type, for example in tension, and one or more strained semi-conducting regions according to a second strain type, for example in compression can also be produced, from a substrate such as previously described in connection with the FIG. 1E.

Figure 5A:
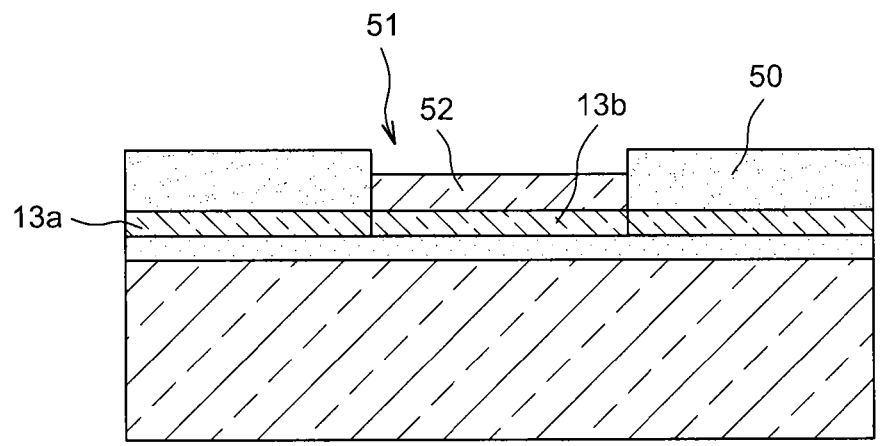
FIGS. 5A-5C illustrate a Germanium enriching of a relaxed region of a layer of tensile strained semi-conductor on insulator in order to form a substrate provided with at least one compressive strained region on insulator and at least one area of tensile strained semi-conductor on insulator.

For this, on the semi-conducting superficial layer 13 of tensile strain silicon, first an oxidation protective mask 50 is formed including at least one aperture 51 exposing said Si based region 13b and the strain of which has been relaxed. This mask 50 can be based on silicon nitride SiN or $Si_3N_4$ and covers the areas 13a of the semi-conducting superficial layer 13 the tensile strain of which has been kept (FIG. 5A).

In this aperture 51 of the mask 50, a layer 52 based on SiGe or $Si_{1-x}Ge_x$ is formed by deposition on the relaxed region 13a.

Thus, the region 13b is enriched with germanium by oxidation through the aperture 51 of the mask 50, the latter protecting the areas 13a from this oxidation.

Figure 5B:
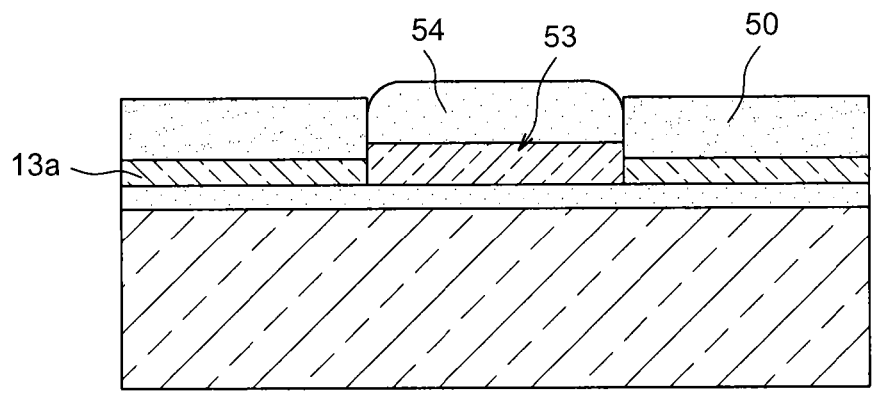
Figure 5C:
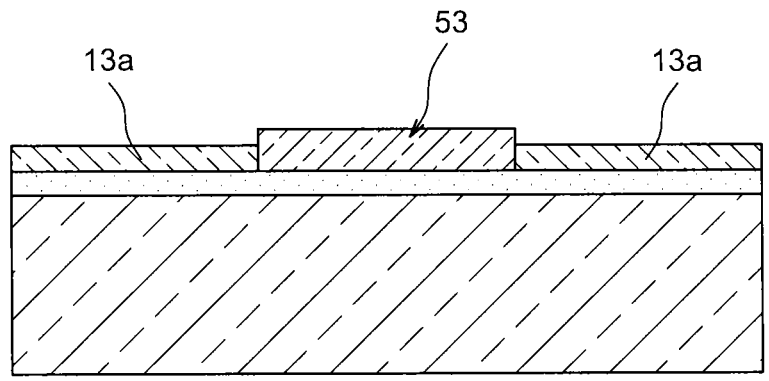

As shown in FIG. 5B, a transformation of the stack formed by the region 13b and the layer 52 of SiGe into a block 53 of $Si_xGe_{1-x}$ lying on the insulating layer 12 of the substrate 10 is obtained. The enriching can be such that the block 53 is entirely made of germanium (x being equal to 0). The block 53 formed is then covered with a layer of silicon oxide 54, which is then removed, as well as the oxidation mask (FIG. 5C). The removal of the mask 50 can be performed for example using a $H_3PO_4$ based solution or by dry etching, whereas that of the silicon oxide layer can be made for example using HF.

Thus, a substrate is obtained including a block 53 of SiGe or germanium on the insulating layer 12 of the substrate, which can be compressive strained and tensile strained areas 13a of Si on this same insulating layer 12 of the substrate.

A planarization, in order to place the germanium enriched block 53 at the same level as the areas 13a, 13b of strained silicon can then be carried out.

According to an alternative implementation of this method, the mask used as an oxidation protection can be the same as that previously used to conduct the steps of amorphization of said region 13b and recrystallization.

Figure 6:
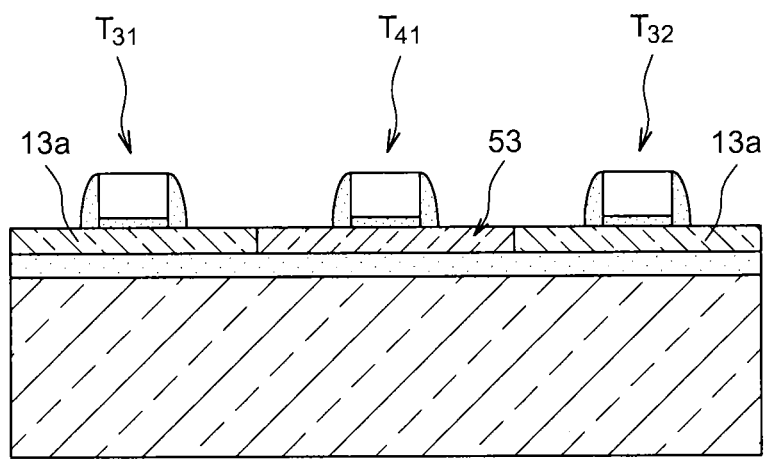
FIG. 6 illustrates a device with transistors formed from a substrate of FIG. 5C and wherein an N-type transistor channel is formed in a tensile strained semi-conductor layer and a P-type transistor channel is formed in a Germanium enriched and compressive strained region of this layer.

NFET type transistors $T_{31}$, $T_{32}$ can then be formed on the areas 13a of the semi-conducting superficial layer 13, whereas a PFET type transistor $T_{41}$ can be made on a Ge enriched block 53 (FIG. 6).

The NFET type transistors $T_{31}$, $T_{32}$ have thus a channel located in tensile strained areas 13a, whereas the transistor $T_{41}$ has a channel located in a compressive strained region 53.

Figure 7A:
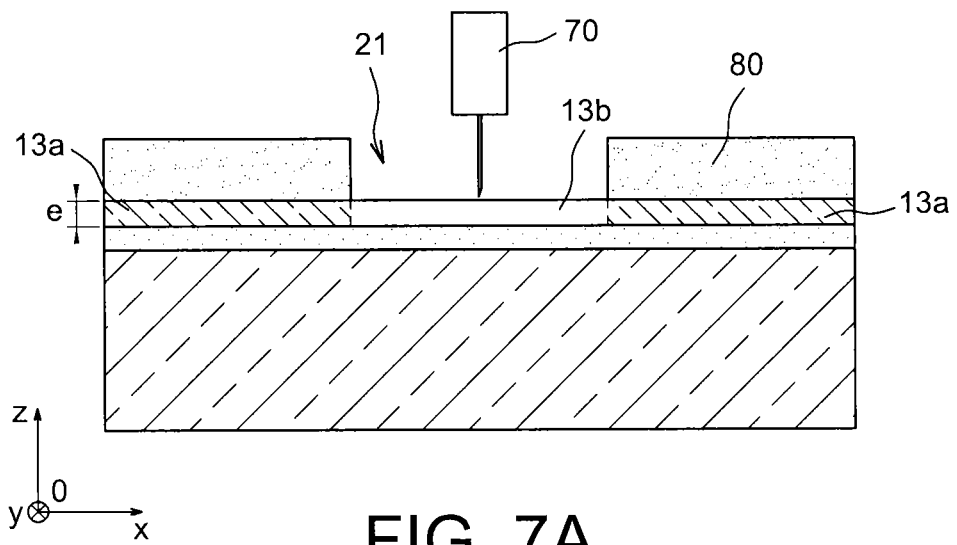
FIGS. 7A-7B illustrate an alternative exemplary method of FIGS. 1A-1B wherein the localized amorphization and lateral recrystallization steps are carried out using a laser.

According to an alternative embodiment of either of the examples of the method just described, the step of amorphization of a region 13b of the superficial layer of a substrate using a laser beam 70 can be made (FIG. 7A).

In this case, a masking 80 comprising or covered with a reflecting coating formed for example by a stack of several layers the index and thickness of which are suitable for the wavelength of the laser in order to reflect the laser radiation and protect the semi-conducting areas 13a which are not intended to be amorphized from this radiation.

According to another possible implementation of the masking, this can be formed by a layer of a sufficient thickness to enable the laser radiation to be absorbed or dispersed and an amorphization to be prevented.

The laser used can be for example an excimer XeCl laser the power of which can be between for example 100 $mJ/cm^2$ and 400 $mJ/cm^2$ or a ruby laser. The laser radiation can be applied as pulses having a duration for example between 2.5 ns and 100 ns.

The step of recrystallization of the amorphized region 13b, by using the lateral faces 15a, 16a of the areas 13a adjacent to and adjoining the region 13b, as starting areas to recrystallization fronts, is then carried out by this same laser.

According to an alternative (FIGS. 8A-8B) embodiment of the method previously described in connection with FIGS. 1A-1E, the only partial recrystallization of the amorphous region 13b can be attempted so as to keep an amorphous portion 33 in the superficial layer 13 at the end of the lateral recrystallization step.

Thus, the lateral faces 15a, 16a of the crystalline areas 13a provided on either side and adjoining the amorphous region 13b are used as starting areas to lateral recrystallization fronts, but this recrystallization of the amorphous region 13b is in this example performed during a determined period of time of the recrystallization heat treatment which should be short enough to allow an amorphous portion 33 in the region 13b to be kept.

Figure 8A:
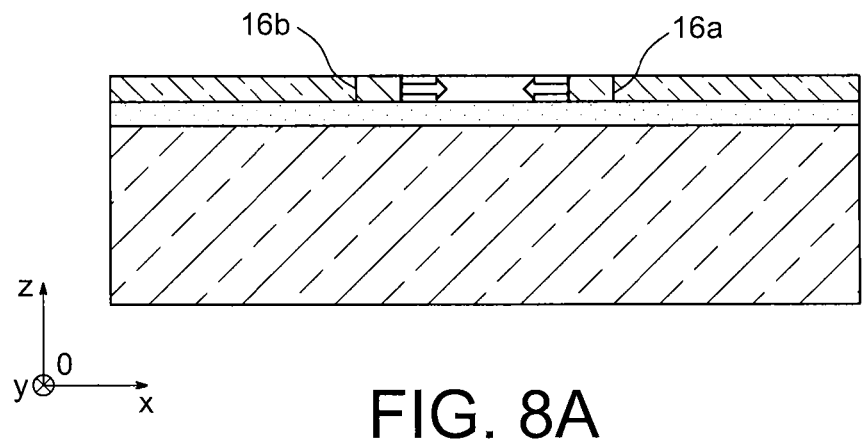
FIGS. 8A-8B illustrate an alternative embodiment wherein a localized amorphization and then a lateral recrystallization of a semi-conducting layer are carried out, the recrystallization of this region being partial so as to keep an amorphous portion.
Figure 8B:
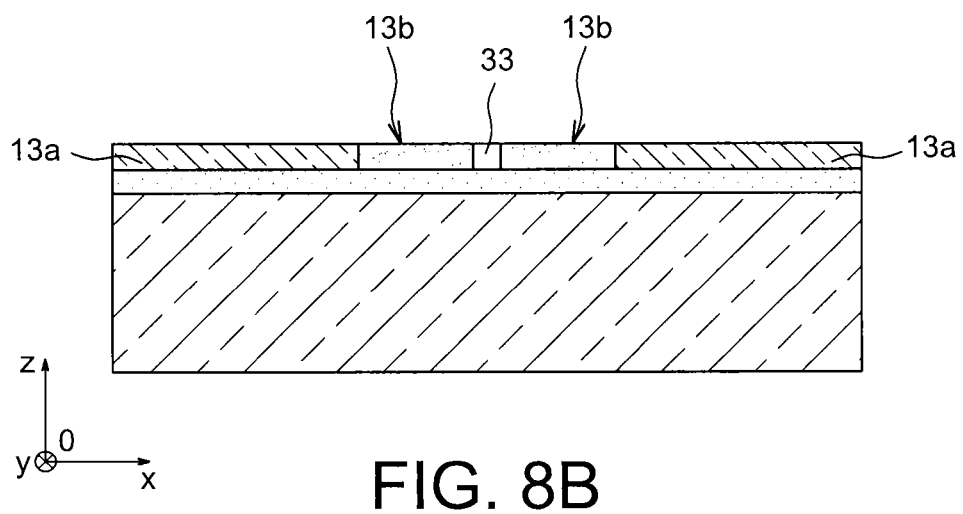

When the lateral recrystallization is made via a thermal annealing from a structure such as illustrated in FIG. 8A, at a given annealing temperature, the duration of this annealing is adjusted short enough such that lateral recrystallization fronts F1, F2 propagating from the lateral faces 15a, 16a do not have time to meet each other.

Figure 9:
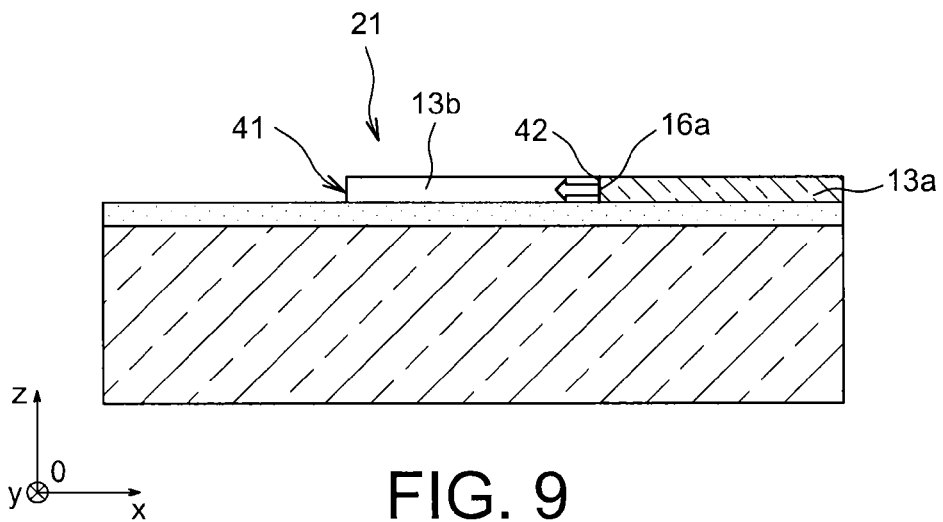
FIG. 9 illustrates an alternative embodiment of a method according to the invention wherein a recrystallization of an amorphous semi-conducting region partly surrounded by an area of crystalline semi-conductor material is carried out.
Figure 10:
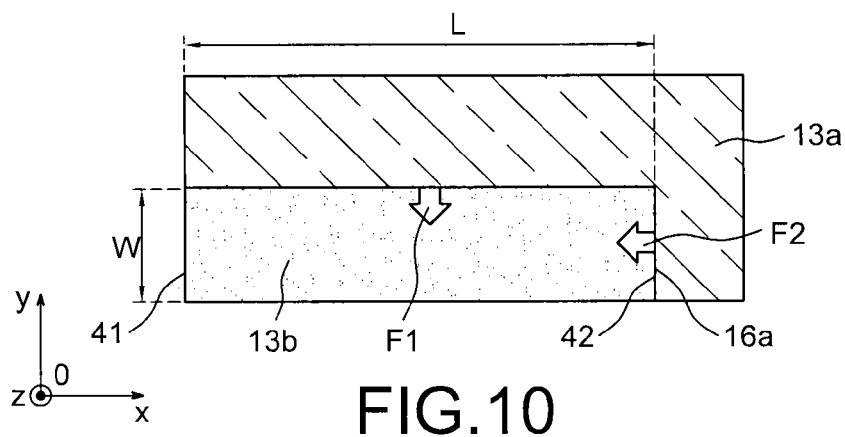
FIG. 10 illustrates, in a top view, an alternative embodiment of a method according to the invention wherein a recrystallization of an amorphous semi-conducting region provided with a high aspect ratio in order to restrict the meeting areas between recrystallization fronts propagating in different directions is performed.
Figure 11:
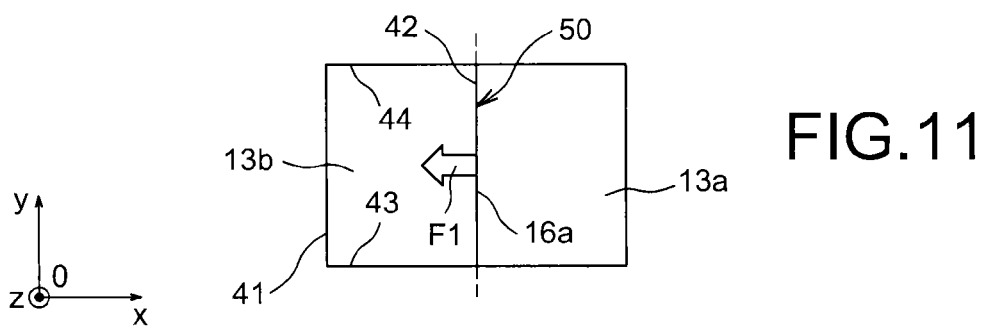
FIG. 11 illustrates, in a top view, an alternative embodiment of a method according to the invention, wherein a recrystallization of an amorphous semi-conducting region of which a single one of its lateral faces is adjoining an area of crystalline material, its other lateral faces being not adjoining a crystalline material in order to create a recrystallization front propagating in a single direction.

The lateral recrystallization method can be made on an amorphized region 13b which is not wholly surrounded by areas of crystalline semi-conductor material, as is illustrated on the respective structures of FIGS. 9, 10, 11 (the structure being represented in a top view in FIGS. 10 and 11) including an amorphized region 13b provided with at least one first face 41 which is free and is in particular not adjoining a crystalline area, whereas at least one second face 42 is adjoining a crystalline area 13a.

In the example of FIG. 10, the structure is also provided with an amorphous region 13b (illustrated in top view), the L/W aspect ratio of which between its length L and its width W measured parallel to the plane of the substrate (i.e. a plane [0, x, y] of an orthogonal reference frame [0, x, y, z] given in FIG. 10) is planned to be at least 1, so as to restrict the extent of the portions of the region 13b where several lateral recrystallization fronts F1, F2 propagating in different directions are likely to meet each other.

In the example of FIG. 11, the arrangement between the amorphous region 13b (illustrated in top view) and the crystalline area(s) 13a is this time provided such that a boundary 50 between the amorphous region 13b and the crystalline area(s) 13a adjoining this region, forms a single plane making a non-zero angle with the main plane of the substrate. This plane can for example be orthogonal or substantially orthogonal to the main plane of the substrate.

The amorphous region 13b thus includes a single lateral face 42 in contact with an area of crystalline semi-conductor material, the other lateral faces 41, 43, 44 (in this example parallel to the axis z of the reference frame [0, x, y, z] of the amorphous region being not in contact with any other material or being in contact with another material from which a crystallization front cannot be generated, in particular a material which is not a semi-conductor and preferably is not crystalline.

Thus, when the crystallization heat treatment of the amorphous region 13b is carried out, a recrystallization lateral front F1 is advantageously created, which is the only one and is not made to meet another recrystallization front.

In the exemplary embodiments which have been previously described, the region which is recrystallized is not covered with any other material. Thus, no recrystallization front is likely to be generated at its upper face.

Figure 7B:
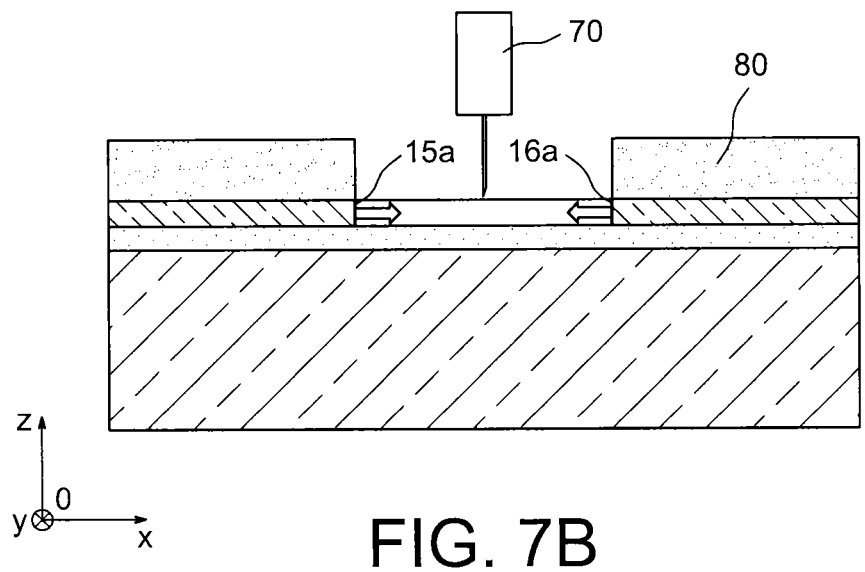
Figure 12:
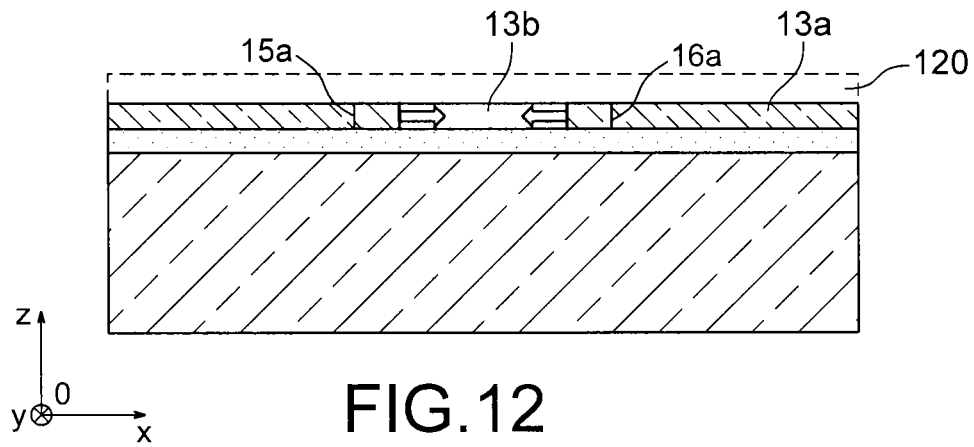
FIG. 12 illustrates an alternative embodiment of a method according to the invention wherein a lateral recrystallization of an amorphous semi-conducting region is carried out, the lateral faces adjoining an area of crystalline material, this region having upper and lower faces adjoining areas of materials which are not favorable for forming recrystallization.

In FIG. 12, the region 13b which is recrystallized is covered and in contact with a layer 120 of a material from which a recrystallization front cannot be generated. The material of the layer 120 is a material which is not a semi-conductor and preferably is not crystalline. The layer 120 can be based on an amorphous material which can be dielectric or for example a resin. Thus, during the recrystallization, as in the examples of FIGS. 1C, 3C, 7B, the recrystallization fronts only propagate in a direction parallel to the insulating layer 12 or to the main plane of the substrate. By main plane of the substrate, it is meant herein and throughout the description, a plane passing through the substrate and which is parallel to the plane [0; x; y] of the orthogonal reference frame [0; x; y; z].

An exemplary method to relax a strained semi-conducting area is illustrated in FIGS. 13A-13C and 14.

This method can be made as in the exemplary embodiments previously described from a strained semi-conductor on insulator type substrate including a semi-conducting superficial layer 13 of semi-conductor material having a bi-axial intrinsic strain.

A portion 130 of the semi-conducting layer 13 is in this example surrounded and in contact with insulating areas 111, which can be STI (Shallow Trench Isolations) type areas passing through the semi-conducting layer 13.

Figure 13A:
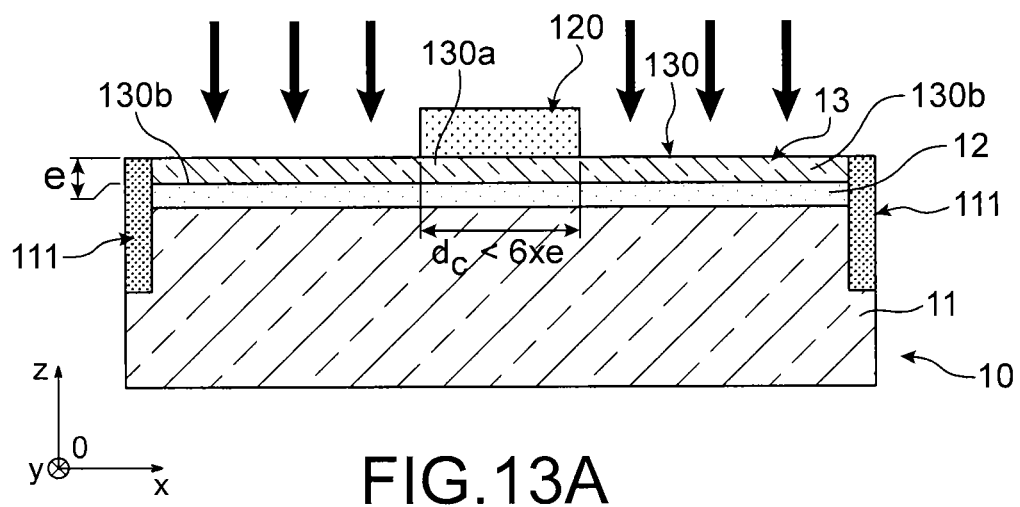
FIGS. 13A-13C, 14 and 15 illustrate a method wherein a portion of a generally strained semi-conducting superficial layer according to a bi-axial strain is transformed into a strained semi-conducting portion according to an uni-axial strain using steps of amorphization and lateral recrystallization.

Then, a masking 120 is formed, which can for example be based on a photosensitive polymer or a hard mask covering an area 130a of the portion 130 of the semi-conducting superficial layer 13, whereas one or more regions 130b adjoining the area 130a covered by the masking 120 are respectively exposed by one or more apertures of the masking 120 (FIG. 13A).

The masking 120 is provided with a critical dimension dc lower than 6 times the thickness e of the superficial layer 13. Thus, the area 130a has a critical dimension dc lower than 6 times the thickness e of the superficial layer 13.

By "critical dimension", it is meant the smallest dimension of a pattern except its thickness. The critical dimension of the masking 120 is in the example of FIG. 13A a dimension measured parallel to the plane [0; x; y] of an orthogonal plane [0; x; y; z], whereas the thickness is measured parallel to the axis z.

Through one or more apertures of the masking 120, an ionic implantation is then carried out, so as to amorphize the regions 130b of the semi-conducting superficial layer 13, whereas the area 130a protected by the masking 20 is not implanted (FIG. 13A). Thus, the crystalline structure of the area 130a having a critical dimension dc lower than 6 times the thickness e of the superficial layer 13 is kept. The regions 130b are amorphized throughout their thickness e that is up to the insulating layer 12 of the substrate.

Implantation conditions such as those described previously in connection with the embodiment of FIGS. 1A-1E can be adopted.

Then, the masking 120 can be removed.

Figure 13B:
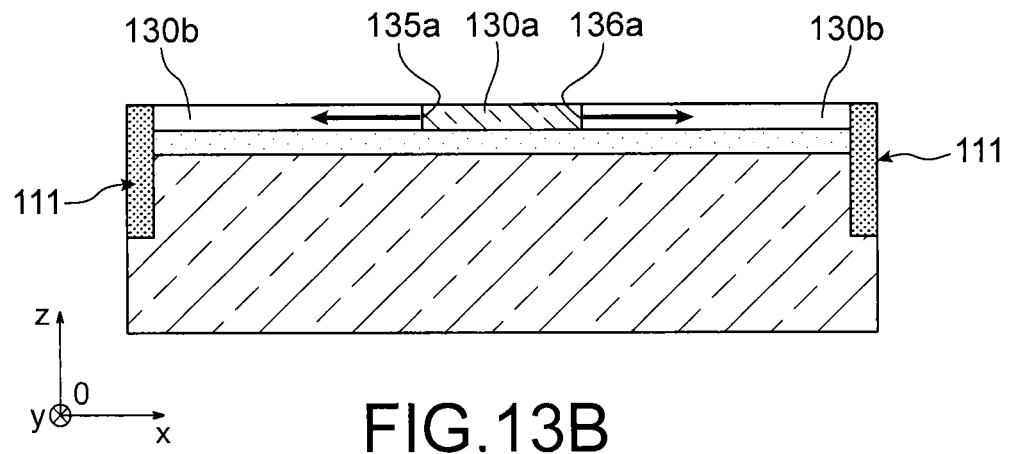
Figure 13C:
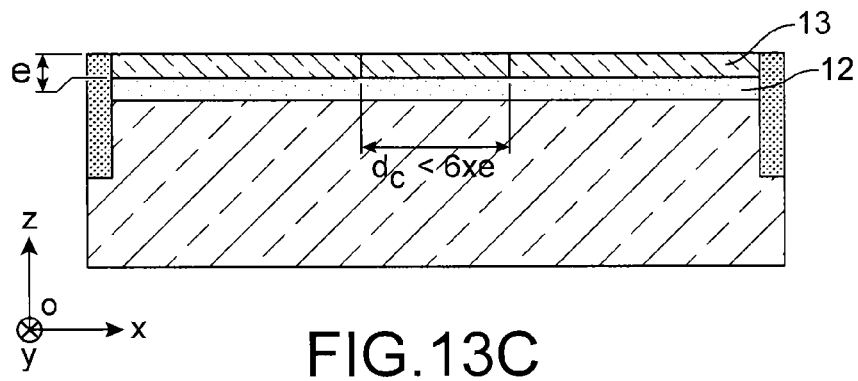
Figure 14:
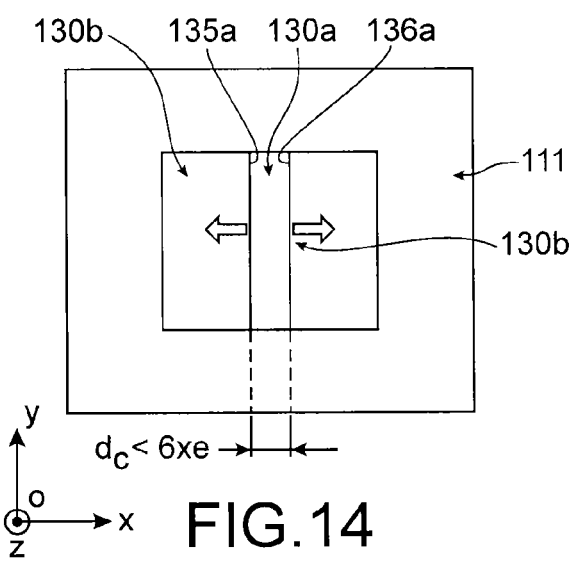

A recrystallization of the amorphized regions 130b is later carried out, by using lateral faces 135a, 136a of the crystalline area 130a which are adjoining the lateral faces of the regions 130b, as starting areas of recrystallization fronts (FIG. 13B and FIG. 14 illustrating the figure in a top view).

The regions 13b include lateral faces which in this example extend parallel to the vector z of the orthogonal reference frame [0, x, y, z] and are partly adjoining a crystalline area 13a and partly the STI type insulating areas 111. These regions 130b include an upper face which extends parallel to the plane [0, x, y] of the orthogonal reference frame [0, x, y, z], which face is exposed and not covered and not in contact with any other material. The regions 130b further include a lower face which extend parallel to the plane [0, x, y] of the orthogonal reference frame [0, x, y, z] and is provided on and in contact with the insulating layer of the substrate.

Due to the composition of the areas with which the regions 130b are in contact, the upper face of the regions 130b, the lower face of the regions 130b and the lateral face(s) of the regions 130b, are not favorable areas for creating recrystallization fronts.

Thus, due the arrangement of the regions 130b, the recrystallization implemented is herein only lateral.

To carry out the recrystallization, an annealing is performed. Implantation conditions such as those previously described in connection for example with the embodiment of FIGS. 1A-1E can be adopted. Through this annealing, crystal seeds are laterally grown from the lateral face of the regions 130b in contact with the area 130a. A recrystallization front is then horizontally moved, that is parallel to the main plane of the substrate.

The inventors have found that by adequately selecting the dimensions of the area 130a the crystalline structure of which has been kept and from which the recrystallization fronts are initiated, a relaxation of the semi-conducting portion 130 is achieved, which includes the area 130a and the regions 130b which have been amorphized and then recrystallized. This relaxation is such that the initially bi-axial strain of the semi-conductor material of the portion 130 can be transformed into a uni-axial strain. Thus, a strain of the semi-conductor material can be eliminated or reduced in a first direction substantially parallel to that in which the critical dimension dc is measured, while keeping a uni-axial strain of the semi-conductor material in a second direction substantially orthogonal to the first direction. In the example of FIG. 14, the first direction is parallel to the axis x, whereas the second direction is parallel to the axis y of the orthogonal reference frame [0, x, y, z].

At the end of the so-called "side" recrystallization a semi-conductor on insulator type substrate, is obtained including a portion 130 of the semi-conducting superficial layer 13 which includes a uni-axial stream. In this portion 130 of the semi-conducting superficial layer 13, one or more channels of transistors can be provided.

This (these) channel(s) will be oriented with respect to the first and second directions depending on the transistor type which is desired to be produced, NMOS or PMOS. This (these) channel(s) will thus be oriented as a function of the direction of the uni-axial stress or the direction wherein the semiconductor material is relaxed.

As for the exemplary method previously described in connection with FIGS. 1A-1E, the method just described in connection with FIGS. 13A-13C and 14 can be produced from an sSiGeOI (strained silicon germanium on insulator) or sSOI type starting substrate.

Figure 15:
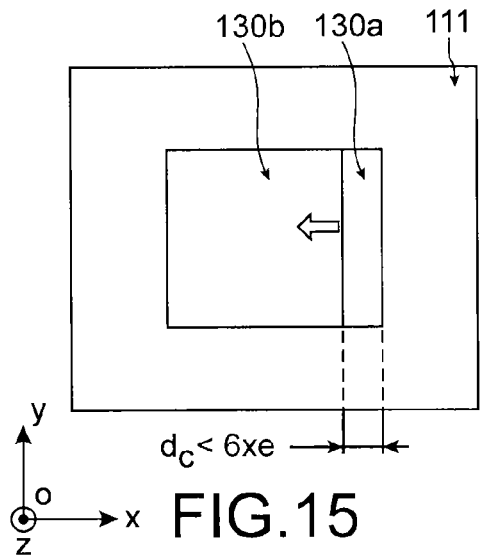

FIG. 15 illustrates an alternative embodiment wherein at the end of the amorphization step, the area 130a of the critical dimension dc<6*e the crystalline structure of which is kept is adjoining an amorphous region 130b.

Figure 16:
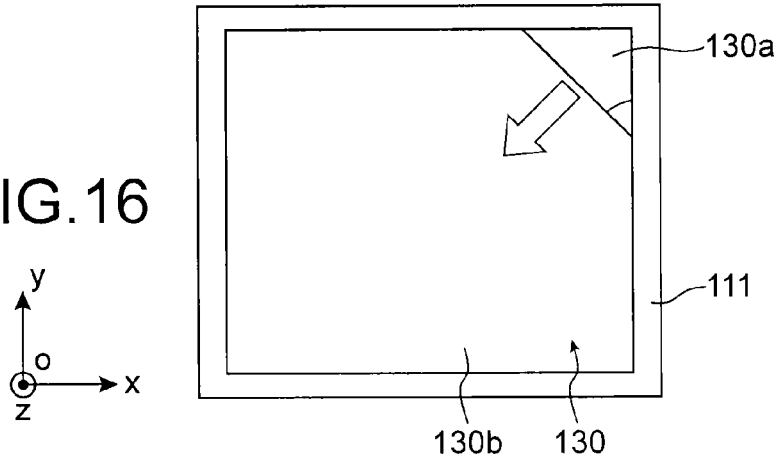
FIG. 16 illustrates an alternative method.

In FIG. 16, an alternative arrangement of the example previously described in connection with FIG. 15 wherein the area 130a the crystalline structure of which is kept has in this example a triangular shape. The portion 130 of the superficial layer 13 which is surrounded by the insulating areas 111 has a rectangular shape. The interface between this crystalline area 130a and the amorphized region 130b thus makes a non-zero angle with sides of the rectangle formed by the portion 130. When a recrystallization of the amorphous region 130b is carried out, a recrystallization front propagating in a direction making a non-zero angle with the sides of the rectangular portion 130 is generated. Such an orientation of the recrystallization front can enable a generally relaxed semi-conducting portion 130 to be obtained.

In this portion 130 of the semi-conducting superficial layer 13, one or more channels of transistors can be provided. Thus, this (these) channel(s) can be oriented parallel to the sides of the rectangle formed by the portion 130.

The invention claimed is:

1. A method comprising, from a strained semi-conductor on insulator type substrate provided with a supporting layer, an insulating layer provided on the supporting layer, and a superficial layer based on a strained crystalline semi-conductor material provided on and in contact with said insulating layer:
    amorphizing at least one exposed region of said strained semi-conductor material of the superficial layer while keeping a crystalline structure of at least one area of the superficial layer of the strained semi-conductor material adjoining said at least one exposed region, said amorphized at least one exposed region having a thickness equal to a thickness of the superficial layer;
    partially recrystallizing said amorphized at least one exposed region by using at least one lateral face of said at least one area of the superficial layer having the crystalline structure in contact with said amorphized at least one exposed region as a starting area of a recrystallization front, said amorphized at least one exposed region not being covered with any other material or, after the amorphizing, being covered and in contact with a material from which the recrystallization front cannot be generated,
    forming, after said recrystallizing, a transistor having a channel in the recrystallized at least one region.

2. The method according to claim 1, wherein the amorphizing is performed using an ion beam through an aperture in a masking formed on the superficial layer having the crystalline structure, the aperture of the masking exposing said at least one exposed region.

3. The method according to claim 1, wherein the strained crystalline semi-conductor material is tensile strained silicon.

4. The method according to claim 3, further comprising, after the at least partially recrystallizing, enriching said at least one exposed region with Germanium.

5. A method for producing a microelectronic device with transistors, comprising performing the method according to claim 4, and further comprising, after the at least partially recrystallizing, producing at least one P-type transistor and at least one N-type transistor, said at least one exposed region for forming a channel region for said P transistor, said at least one area for forming a channel region for said N transistor.

6. The method according to claim 1, wherein said strained crystalline semi-conductor material is compressive strained silicon germanium.

7. The method according to claim 6, wherein the compressive strained silicon germanium is obtained prior to the amorphizing by enriching a Si layer lying on said insulating layer with Ge.

8. A method for producing a microelectronic device according to claim 6, further comprising, after the at least partially recrystallizing, producing at least one N-type transistor and at least one P-type transistor, said at least one exposed region for forming a channel region for said N transistor, said at least one area for forming a channel region for said P transistor.

9. The method according to claim 1, wherein the amorphizing and the at least partially recrystallizing are performed using a laser.

10. The method according to claim 1, wherein the at least partially recrystallizing comprises at least one thermal annealing.

11. The method according to claim 10, wherein the at least partially recrystallizing is a partial recrystallization of said at least one exposed region so as to keep at an end of the at least partially recrystallizing, an amorphous portion in said at least one exposed region.

12. The method according to claim 1, comprising said material from which the recrystallization front cannot be generated, and wherein said amorphized at least one exposed region and said at least partially recrystallized region include another lateral face adjoining said at least one area of said superficial layer having the crystalline structure, other lateral faces of the amorphized at least one exposed region being in contact with the material from which the recrystallization front cannot be generated.

13. The method according to claim 1, wherein said amorphized at least one exposed region comprises a region relaxed from mechanical strains induced by vertical recrystallization.

14. A method for producing a semi-conducting portion having uni-axial strain, comprising:
    providing a strained semi-conductor on insulator type substrate comprising a supporting layer, an insulating layer provided on the supporting layer, and a semi-conducting superficial layer having a thickness based on a crystalline strained semi-conductor material provided on and in contact with the insulating layer, a semi-conducting portion of the superficial layer being surrounded and in contact with insulating areas;
    amorphizing at least one exposed region of a portion of the crystalline strained semi-conductor material while keeping a crystalline structure of at least one area of said portion adjoining said at least one exposed region, said amorphized at least one exposed region having a thickness equal to a thickness of the superficial layer, said at least one area having a critical dimension lower than 6 times the thickness of the superficial layer;
    recrystallizing said amorphized at least one exposed region by using at least one lateral face of said at least one area in contact with said region as a starting zone of a recrystallization front, said amorphized at least one exposed region not being covered with any other material or, after the amorphizing, being covered and in contact with a material from which the recrystallization front cannot be generated, and
    forming, after said recrystallizing, a transistor having a channel in the recrystallized at least one region.

15. The method according to claim 14, wherein the amorphizing is performed using an ion beam through an aperture in a masking formed on the semi-conducting superficial layer, the aperture of the masking exposing said at least one exposed region.

16. The method according to claim 14, wherein the crystalline strained semi-conductor material is a tensile strained silicon.

17. The method according to claim 14, wherein the crystalline strained semi-conductor material is compressive strained silicon germanium.

18. A method for producing a microelectronic device with transistors, comprising performing the method according to claim 14, and further comprising, after the at least partially recrystallizing, producing at least one P-type transistor or at least one N-type transistor, said portion for forming a channel region for said P-type transistor or for said N-type transistor.

19. The method according to claim 14, wherein said amorphized at least one exposed region comprises a region relaxed from mechanical strains induced by vertical recrystallization.

20. A method comprising, from a strained semi-conductor on insulator type substrate provided with a supporting layer, an insulating layer provided on the supporting layer, and a superficial layer based on a strained crystalline semi-conductor material provided on and in contact with said insulating layer:
    amorphizing at least one region of said strained semiconductor material of the superficial layer while keeping a crystalline structure of at least one area of the superficial layer of the strained semi-conductor material adjoining said at least one region, said amorphized at least one region having a thickness equal to a thickness of the superficial layer;
    recrystallizing said amorphized at least one region by using at least one lateral face of said at least one area of the superficial layer having the crystalline structure in contact with said amorphized at least one region as a starting area of a recrystallization front, said amorphized at least one region not being covered with any other material or, after the amorphizing, being covered and in contact with a material from which the recrystallization front cannot be generated,
    wherein consequently to said amorphizing and said recrystallizing, said at least one region is relaxed; and
    forming, after said recrystallizing, at least a transistor gate on said recrystallized at least one region.

21. The method according to claim 20, further comprising, after said recrystallizing and prior to the forming of said transistor gate, enriching said at least one region with germanium.

22. The method according to claim 20, wherein said amorphized at least one exposed region comprises a region relaxed from mechanical strains induced by vertical recrystallization.

\* \* \* \* \*